United States Patent [19]
Claxton et al.

[11] 3,964,060
[45] June 15, 1976

[54] ANALOG-TO-DIGITAL CONVERTERS UTILIZING GUNN EFFECT DEVICES

[75] Inventors: Dale H. Claxton, Hawthorne; Chauncey S. Miller, Rancho Palos Verdes, both of Calif.

[73] Assignee: TRW Inc., Redondo Beach, Calif.

[22] Filed: July 2, 1975

[21] Appl. No.: 592,421

[52] U.S. Cl. .............................. 340/347 AD; 357/3
[51] Int. Cl.² .......................................... H03K 13/17
[58] Field of Search ........... 357/3; 307/235; 330/69; 340/347 AD

[56] References Cited
UNITED STATES PATENTS

| | | | |
|---|---|---|---|
| 2,950,469 | 8/1960 | Raasch | 340/347 AD |
| 3,178,700 | 4/1965 | Kaenel | 340/347 AD |
| 3,242,479 | 3/1966 | Euler | 340/347 AD |
| 3,594,618 | 7/1971 | Hartnagel | 340/347 AD |
| 3,766,372 | 10/1973 | Kataoka | 357/3 |

*Primary Examiner*—Charles D. Miller
*Attorney, Agent, or Firm*—Daniel T. Anderson; Edwin A. Oser; Jerry A. Dinardo

[57] ABSTRACT

A parallel or serial analog-to-digital converter utilizing both Gunn effect devices and field effect transistors. The converters are based on a differential pair of amplifiers consisting of two or more Gunn effect devices, one of which is biased close to the knee of the current-voltage characteristic before the negative resistance region. Hence a clock pulse will bias one of the devices into the negative resistance region while the other device is now biased close to the knee to be able to respond to the analog signal. This is due to the fact that both devices are biased by a common constant current source, including a field effect transistor.

30 Claims, 7 Drawing Figures

ANALOG-TO-DIGITAL CONVERTERS UTILIZING GUNN EFFECT DEVICES

BACKGROUND OF THE INVENTION

This invention relates generally to high speed analog-to-digital converters and particularly relates to such converters utilizing Gunn effect devices and field effect transistors.

The analog-to-digital converter is a key element in digital signal processing. In recent years signal processing techniques have gone to signals of higher center frequency and wider bandwidth because this will yield a high performance system with relatively low cost. It will, therefore, be evident that the speed, that is the sampling rate per second and the accuracy of the converter limits this type of application.

The bandwidth of the signal to be converted into digital signals is limited to less than half the sampling rate. Therefore, the clock pulse rate is also of importance. The number of levels into which the amplitude of the analog signal is converted limits the amount of information available and imposes a signal-to-noise ratio constraint. This is due to the fact that the number of levels into which the analog signal is converted is limited rather than being infinite. Thus, an error may be caused because a signal level may not be quite at the lower or upper limit. Therefore, the analog-to-digital converter limits the amount of information available for subsequent digital processing.

Typical state-of-the-art converters provide sample rates of 400 megasamples (MS) per second and with 5 bit conversion levels or resolution. It is, therefore, desirable to provide higher sample rates which present converters cannot provide.

Analog-to-digital converters could either be used in parallel or in a series or cascade configuration. The series configuration is preferred because it requires less equipment and hence is less costly. However, for high accuracy both the signal amplitude and the time delay between successive sampling periods must be controlled with great precision. Generally delays of a few nanoseconds between successive stages and successive sampling periods are required. Such relatively large time delays cannot be obtained on an integrated circuit chip. Therefore, it is necessary to transfer the signal from the integrated circuit chip to a transmission line and back to the same or a different chip. It has been a most difficult problem to transfer without distortion a wide bandwidth signal on or off the chip.

Since the maximum clock rate available with silicon devices produces delays of several nanoseconds, it has not been possible to provide a high speed analog-to-digital converter with a series configuration. Therefore, converters with parallel configurations had to be used. They require a larger number of components and use more power and hence are more expensive to build or operate. Thus in part the performance of the analog-to-digital converter is limited by the cut-off frequency of silicon integrated circuit transistors. Hence the clock rate which determines the sample rate can be no greater than 1/5 of the transistor cut-off frequency and this amounts to a sample rate of 400 megasamples per second as previously referred to.

Accordingly, in accordance with the present invention use is made of Gunn effect devices sometimes known as transferred electron devices as well as field effect transistors. The latter make use of gallium arsenide (GaAs). This will permit a substantial increase in speed.

It is accordingly an object of the present invention to provide a parallel or serial analog-to-digital converter having substantially increased speed and a higher sample rate.

A further object of the present invention is to provide an analog-to-digital converter making use of transferred electron devices and field effect transistors.

Another object of the present invention is to provide an analog-to-digital converter which can be realized as an integrated circuit chip with vastly increased speed or sampling rate.

Still a further object of the present invention is to provide an analog-to-digital converter which can be realized in series configuration and which has time delays on the order of 100 picoseconds.

The Gunn effect has been discovered in 1963 by J. B. Gunn who found that coherent microwave oscillations may be generated in bulk gallium arsenide semiconductor material. The physics of such Gunn effect devices has been explained in a book by S. M. Sze, "Physics of Semiconductor Devices" published by John Wiley and Sons 1969 (see particularly pages 731 – 784).

Specifically, a Gunn triode will amplify an input signal and operates in the microwave region. The device itself is extremely small, that is on the order of 10 – 20 microns long. Even though the effect is a bulk effect, the thickness of the effective layer may be on the order of 1/10 of its length, that is 1 – 2 microns thick. Such devices are characterized not only by their small size, but by appreciable isolation between input and output terminals.

SUMMARY OF THE INVENTION

The present invention is based on a differential pair of amplifiers forming a part of the comparator circuit for an analog-to-digital converter. The differential pair of amplifiers comprise a first and a second transferred electron device, each having two ohmic electrodes and a Schottky barrier electrode. The ohmic electrodes of each of the devices is biased by means including a constant current device. This will then provide a cathode and an anode for each device. Each Schottky electrode is disposed adjacent the associated cathode.

Means are provided for applying a clock pulse to the Schottky electrode of the first device. Similarly means are provided for applying an analog signal to the Schottky electrode of the second device.

Each of the two devices has a current-voltage characteristic including a negative resistance branch preceded by a knee. The first device is biased near the knee of its current-voltage characteristic while the second device is biased further from the knee of its current-voltage characteristic. As a result a clock pulse will move the first device into the negative resistance branch the second device near the knee so as to be able to respond to the analog signal. This is the basis for either a parallel or series analog-to-digital converter.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings wherein like elements are dissipated by the same reference numbers.

DESCRIPTION OF THE PREFERRED EMBODIMENTS

Figure 1:
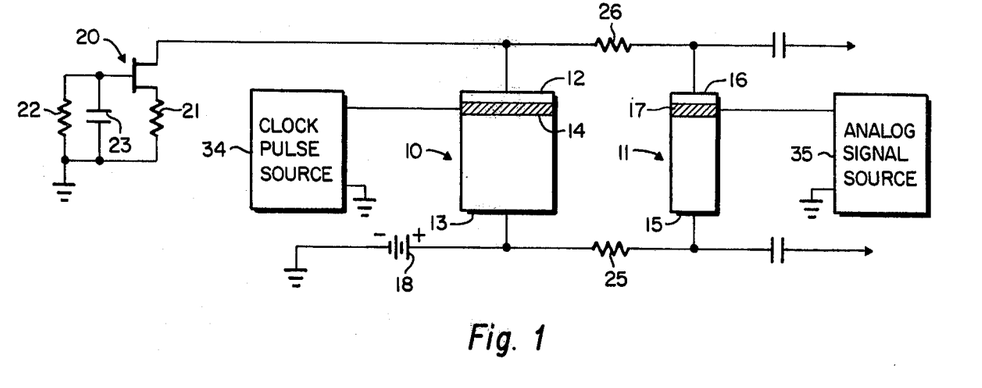
FIG. 1 is a circuit diagram of a differential pair of amplifiers forming the heart of the converter of the invention.

Referring now to the drawings and particularly to FIG. 1, there is illustrated a differential pair of amplifiers which is basic for the analog-to-digital converter of the present invention. The differential pair of amplifiers includes a first Gunn effect device 10 and a second Gunn effect device 11. These devices are sometimes referred to as transferred electron devices.

A Gunn effect device comprises a substrate of semi-insulating material. This may, for example, consist of gallium arsenide (GaAs) having a resistivity on the order of $10^9$ ohms per centimeter. The gallium arsenide is relatively pure and hence has a high resistance. The Gunn effect is also exhibited by other materials including germanium and certain compound semiconductors such as InP.

A semiconductive material is disposed on the substrate. This semiconductive material must exhibit the Gunn effect and hence has a differential negative resistance and is capable of domain nucleation under proper bias conductions. This semiconductive material may consist of n-type gallium arsenide having an impurity concentration on the order of $10^{15}$ to $10^{17}$ atoms per cubic centimeter.

The ohmic electrodes are of the conventional type and may consist of a metal coating such as gold-tin-gold or gold-germanium. A Schottky barrier electrode may, for example, consist of a metal-semiconductor junction, for example, of gold on gallium arsenide.

The transferred electron device 10 which may be called a triode has two ohmic electrodes 12 and 13. They are biased in such a way that the electrode 12 becomes a cathode and the electron 13 the anode. The Schottky barrier electrode 14 is disposed adjacent to or near the cathode 12. Similarly, the transferred electron device 11 includes an anode 15, a cathode 16 and a Schottky barrier electrode 17.

The two devices 10 and 11 are biased by a source of voltage 18 having its negative terminal grounded while its positive terminal is connected to its anode 13. The circuit is completed through a field effect transistor 20, the drain of which is connected to the cathode 12 while the source is connected through a resistor 21 to ground. The gate of the field effect transistor 20 is connected through the parallel combination of a resistor 22 and a capacitor 23 to ground. This combination provides a constant current source through which the current from both devices 10 and 11 must flow.

The device 10 is so arranged that it carries more current than the device 11. This may, for example, be accomplished by making the width of the device 10 between its ohmic electrodes 12 and 13 wider than the width of the device 11 between its ohmic electrodes 15 and 16. The device 11 is biased by means of a bias resistor 25 connected between the positive pole of battery 18 and the anode 15. Similarly, a resistor 26 is interposed between the cathode 16 and the drain of the field effect transistor 21.

Figure 2:
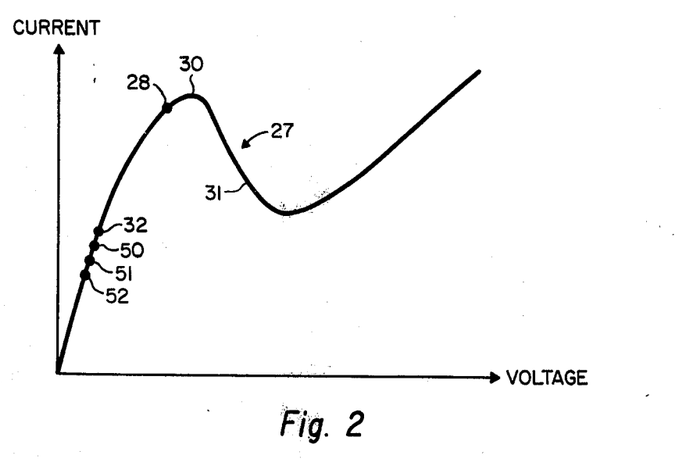
FIG. 2 is a chart of the current-voltage characteristic of two or more transferred electron devices before the arrival of a clock pulse.

The devices 10 and 11 have a current-voltage characteristic 27 shown in FIG. 2. The voltages are so adjusted that the device 10 is biased as shown by the point 28 on the curve 27, that is near the knee 30 of the curve 27 which precedes the negative resistance branch 31. The device 11, on the other hand, is biased to the point 32 of FIG. 2, that is further from the knee 30 of the characteristic curve. This can readily be achieved by a suitable choice of resistors 25 and 26 and the voltage of battery 18.

A clock pulse source 34 is connected to the Schottky electrode 14 of the first device 10. Similarly, an analog signal source 35 is connected to the Schottky electrode 17 of the device 11.

Figure 3:
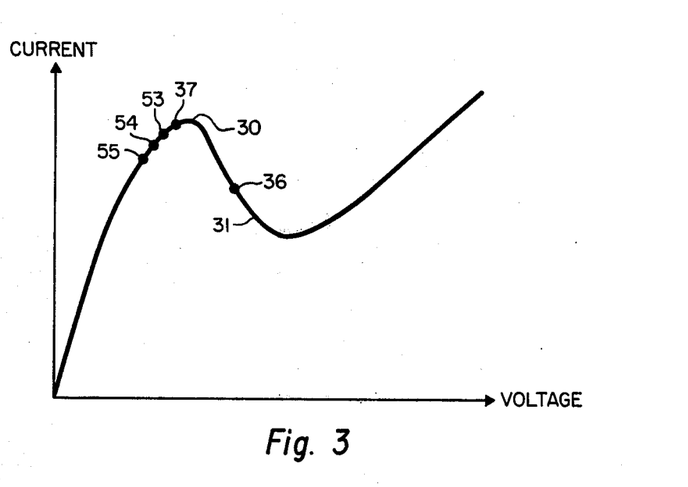
FIG. 3 is a curve similar to that of FIG. 2 and showing the current-voltage characteristic of two or more transferred electron devices after the arrival of a clock pulse but before the arrival of the analog signal.

Assuming now that a clock pulse is impressed upon the Schottky electrode 14 this will move or bias the device 10 from the point 28 on FIG. 2 to the point 36 of FIG. 3, that is it will now be on the negative resistance branch 31 of the characteristic curve. Since the two devices 10 and 11 are connected to the same constant current source and because the current through the device 11 is reduced, the current through the device 11 must increase. This will be obvious because the total current through the two devices 10 and 11 must always be equal. As a result, the operating point 37 of the device 11 moves closer to the knee 30.

It will thus be evident that once a clock pulse triggers the device 10 it will then render the device 11 sensitive to respond to the analog signal from the signal source 35.

The aperture time of the differential pair of amplifiers of FIG. 1, that is the time during which the circuit is ready to respond to an analog signal is essentially the domain transit time through the device 10. In order to have as short an aperture time as possible the active length of the device 10 should be as short as possible and an aperture time of the order of 10 picoseconds can be achieved.

Figure 4:
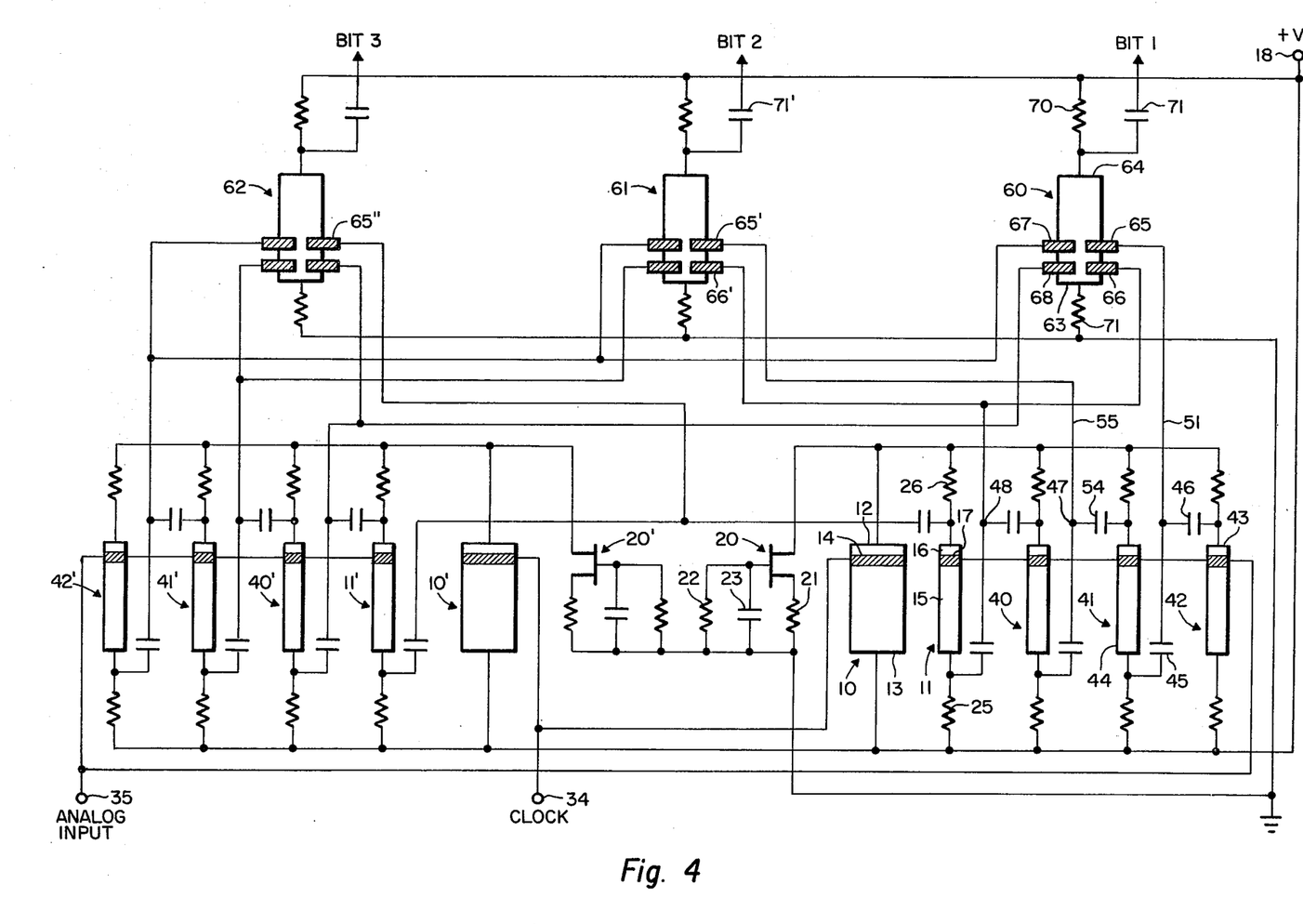
FIG. 4 is a circuit diagram of a parallel configuration of an analog-to-digital converter in accordance with the present invention for generating three output bits.

A complete analog-to-digital converter of the parallel type is illustrated in FIG. 4 to which reference is now made. Since some of the elements of the circuit of FIG. 4 are identical to those of FIG. 1 they will be designated by the same reference numbers. Thus the circuit of FIG. 4 includes a comparator which in turn includes the two Gunn effect devices or triodes 10 and 11 as previously explained and the constant current source 20 consisting of a field effect transistor. The field effect transistor may consist of Gallium arsenide. The right-hand half of the comparator circuit includes additional Gunn effect triodes or transferred electron devices 40, 41 and 42. Thus there is a total of four of these triodes 11 and 40 – 42. The number of these devices depends on the number of input analog levels which are to be distinguished. Thus with four devices, four levels can be distinguished.

The output of the device 42 may be obtained from its cathode 43 which is coupled to the output obtained from the anode 44 of the device 41. This may be accomplished by the summing capacitors 45 and 46 from which the sum of the outputs of the two devices 42 and 41 can be obtained and subsequently processed. The summing capacitors such as 45, 46 form the decoder of the converter which are then followed by an encoder which will be subsequently explained. The same circuitry is used for obtaining the summed signal from the cathode of device 41 and the anode of device 40 at point 47 and similarly point 48 corresponds to the sum of the signal from the cathode of device 40 and the anode of device 11.

The comparator of FIG. 4 includes an identical second half which completes the comparator. Corresponding elements will be designated by corresponding reference numbers primed.

The devices or triodes 11, 40, 41 and 42 are differentially biased by means of their respective bias resistors such as 25 and 26. They should be so selected that the bias points of devices 40, 41 and 42 are shown at 50, 51 and 52 of the curve 27 of FIG. 2. Accordingly, when the first device 10 is conditioned by the arrival of a clock pulse the bias points of the device 11 and 40 through 42 are shown in FIG. 3 respectively at 37, 53, 54 and 55. Accordingly, it will be evident that one or more of the devices 11 and 40 through 42 respond depending on the amplitude of the analog signal. The same, of course, applies to the corresponding devices 10', 11' and 40' through 42'.

Figure 5:
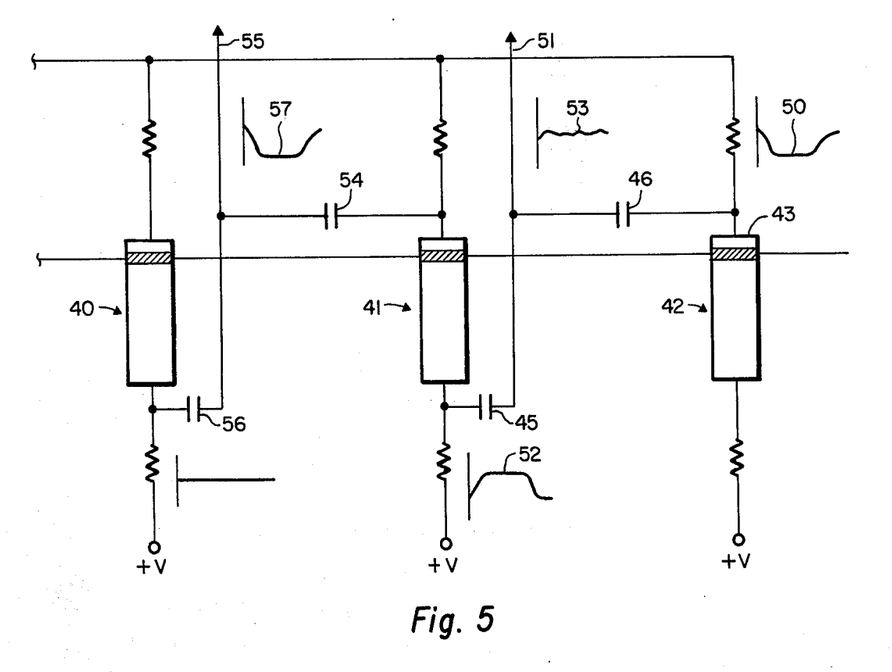
FIG. 5 is a circuit diagram of a portion of the circuit of FIG. 4 to illustrate the decoder operation.

Thus to emphasize again the summing capacitors such as 45 and 46 form the decoder of the converter. This will be more fully explained by reference to FIG. 5 showing three transferred electron devices which may again be identified by 40, 41 and 42.

Thus, FIG. 4 shows one example of a decoder for a particular type of analog input signal. It determines in which of the triodes, that is 40, 41 and 42 domains have been formed in response to the analog input. The output of the decoder then is fed to the encoder to be subsequently explained. Assuming now that the analog level is such that triodes 41 and 42 have been triggered but not the triode 40. A negative output pulse 50 is obtained from the cathode 43 of device 42 and is coupled by capacitor 46 to the output lead 51. At the same time a positive pulse as shown at 52 is obtained from the anode of the device 41 and is also coupled to the output lead 51 by the summing capacitor 45. Hence, it will be apparent that the two pulses having opposite polarity cancel each other. To summarize the reason is that both devices 41 and 42 have domains formed therein but since opposite polarity output pulses are obtained from their respective cathode and anode the two pulses cancel and the output is shown at 53.

On the other hand, the output obtained from the cathode of device 41 is negative. This pulse is coupled by summing capacitor 54 to the output lead 55. Since there is no output from the cathode of device 40 which is also coupled by coupling capacitor 56 to the output lead, the resulting output pulse 57 is a negative pulse.

It will be noted that the connections of the devices 40 – 42 are such that they will perform an exclusive OR operation between each adjacent pair of triodes. The exclusive OR output obtained from the summing capacitors is only one of one and only one input is present. If there is either no input or two inputs a zero output results.

From the above description the operation of the comparator circuit of FIG. 4 and the summing network will now be evident.

The analog-to-digital converter of the invention also includes an encoder circuit. This consists basically of three transferred electron devices 60, 61 and 62. Each of these devices may be considered a multielectrode device and each has again a cathode such as 63 and an anode such as 64 and four separate Schottky electrodes such as 65, 66, 67 and 68. For convenience the four Schottky electrodes of the devices 61 and 62 may be designated by primed numbers and double primed numbers. Each device such as 60 and 62 is biased by a bias resistor 70 between the voltage source 18 and the anode 64 and another bias resistor 71 between the cathode 63 and ground.

The three multielectrode devices 60 – 62 are so connected as to generate the three binary output bits corresponding to the amplitude of the analog voltage. To this end Schottky electrode 65 is connected to output lead 51 while output lead 55 is connected to Schottky electrode 65'. The output lead corresponding to junction point 48 is connected to Schottky electrode 66 and to Schottky electrode 66'. Similarly, the output of the cathode of device 11 and the anode of device 11' is connected to Schottky electrode 65''. The corresponding outputs of the other set of devices, that is 11' and 40' are similarly connected to the respective Schottky electrodes of the three multielectrode devices 60 – 62.

These multielectrode devices are arranged to provide an OR function, that is they operate as OR gates. In other words, as long as one of the four Schottky electrodes of a device is triggered, an output will be obtained. Thus, each device is so biased that a single input will stimulate an output pulse. The respective output pulses are obtained from output pulses are obtained from output capacitors 71, 71' etc. to generate binary bits 1, 2 and 3 as indicated.

To summarize the operation of the encoder circuit, the outputs of the junctions of adjacent pairs of devices such as 11, 40 – 42 etc. are impressed on one, two or three of the multielectrode devices 60, 61 and 62. Thus, the output of the first pair of devices 40, 42 is impressed only on multielectrode device 60. The next output taken from devices 40, 41 is impressed only on the multielectrode device 61. The next output from the devices 11, 40 is impressed on both devices 60 and 61. The output from devices 11 and 11' is impressed on device 62. Similarly, the output of devices 11', 40' is impressed on devices 62 and 60. Similarly, the output of devices 40' and 41' is impressed on multielectrode devices 61 and 62 and finally the output of devices 41' and 42' is impressed on all three multielectrode devices 60, 61 and 62. Hence, if any one output is impressed on one of the electrodes of multielectrode devices 60, 61 and 62, a bit will be generated.

It will readily be understood that more than three output pulses may be obtained by using more circuit elements. However, no more than four Schottky electrodes will usually be used with a single multielectrode device and therefore if more than three bits are required, more multielectrode devices must be provided. Thus, for a five output bit converter, 32 comparator triodes are required as well as eight of the multielectrode devices. Such a circuit can encode thirty-two analog levels.

Figure 6:
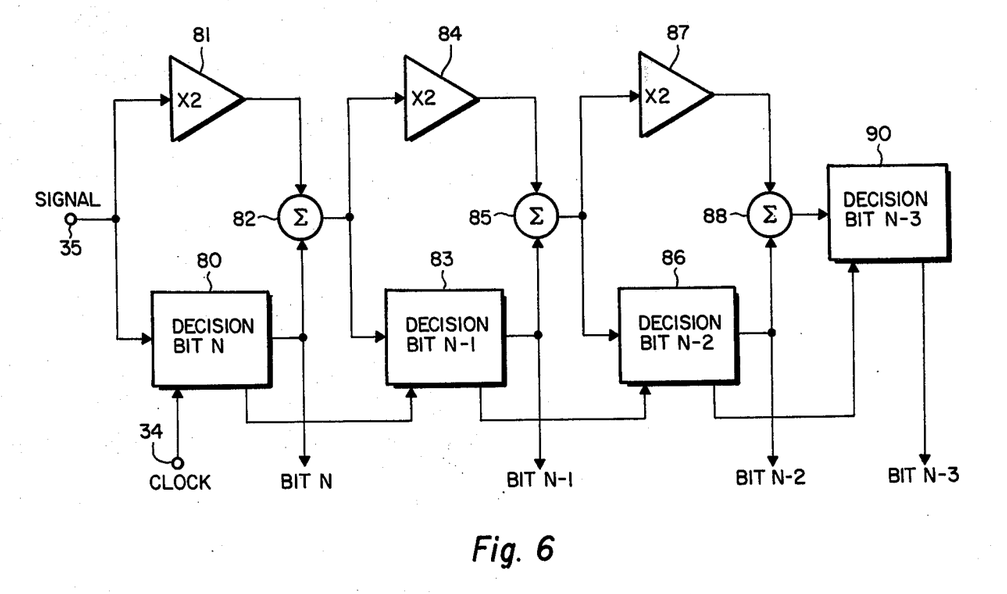
FIG. 6 is a representation in block form of a serial organization of an analog-to-digital converter in accordance with the present invention.
Figure 7:
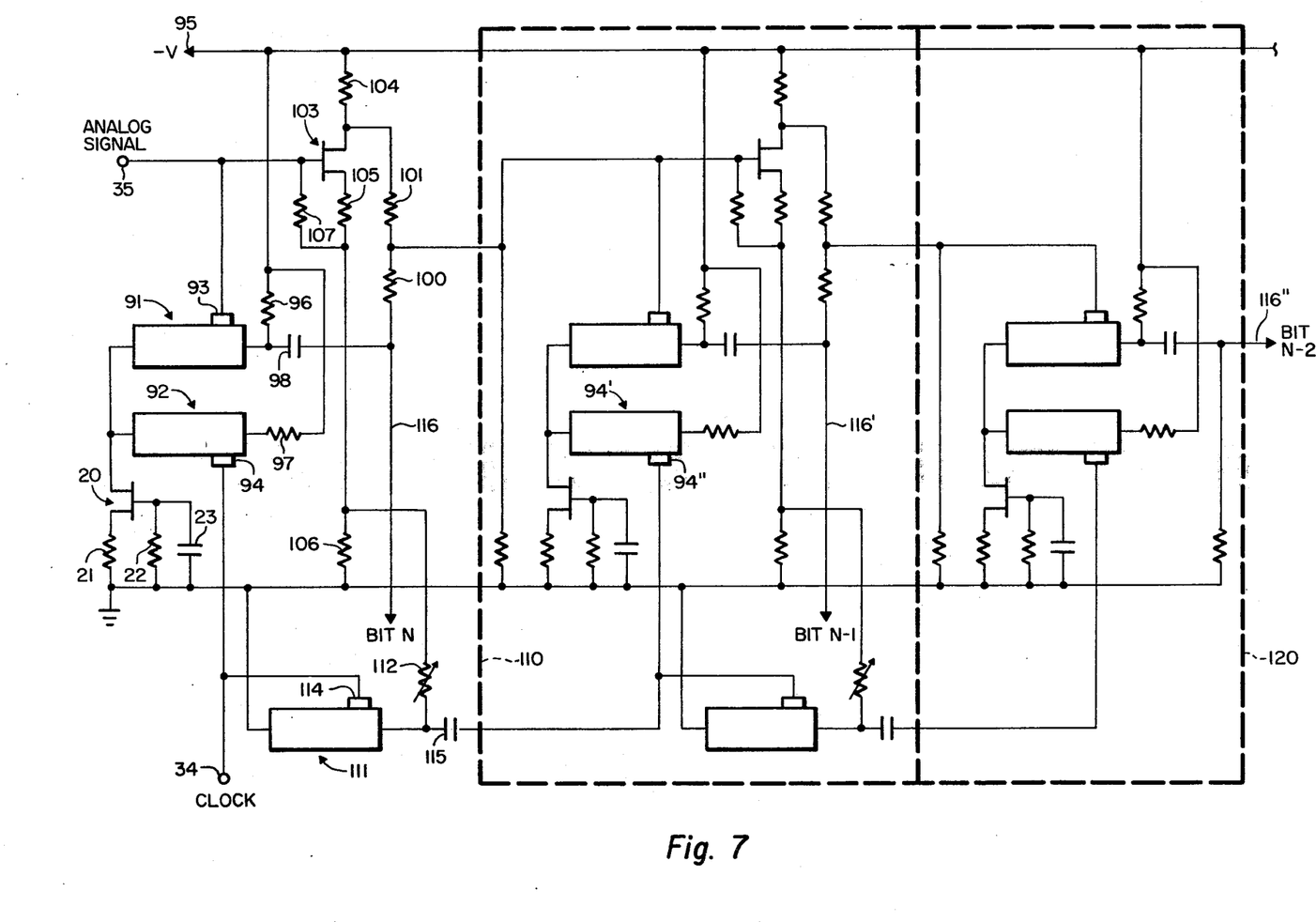
FIG. 7 is a detailed circuit diagram of an analog-to-digital converter having a serial configuration and embodying the present invention and for generating three output bits.

A series analog-to-digital converter in accordance with the present invention is shown schematically in FIG. 6 and in detail in FIG. 7. Referring first to the block diagram of FIG. 6, it will be assumed by way of example that the input signal may vary between 0 and 3.75 volts or more. It will also be assumed that a four binary bit output signal is desired corresponding to sixteen levels of amplitude of the analog input signal. Therefore, the circuit should measure voltage steps between zero and 3.75 volts at increments of 0.25 volts. Assuming further that the input voltage is 1.4 volts which is between the level of 1.25 and 1.5 volts corresponding to step No. 5 represented by 0101 which is the decimal number 5.

This is accomplished by the circuit of FIG. 6 in the following manner. The analog signal 35 is impressed on a decision circuit 80 which makes the decision whether the input signal is greater than or smaller than 2.0 volts. A clock pulse 34 is also impressed on the decision circuit 80. For the example given the input signal does not exceed 2 volts because it is only 1.4 volts and therefore the bit N generated by the decision circuit 80 is 0.

A linear amplifier 81 multiplies the input signal by two, that is it doubles its amplitude and hence its output voltage is 2.8 volts. The summing circuit 82 connected to the outputs of decision circuit 80 and amplifier 81 generates the difference signal, that is the difference between 2.8 volts and 0 volts which is the output of the decision circuit. Accordingly, 2.8 volts is fed to the subsequent decision circuit 83 which will now issue bit N-1 which is one because the voltage is more than two volts.

This voltage is doubled again by the linear amplifier 84 and the difference is formed by the summing circuit 85. Hence the summing circuit subtracts 4.0 volts from the amplified voltage of 5.6 volts leaving a 1.6 volt input signal to the next decision circuit 86. This circuit generates bit N-2 which is 0 because the input is less than 2 volts. Again, the 1.6 volt input voltage is doubled by the amplifier 87 and the doubled voltage of 3.2 volts is generated by the summing circuit 88 and fed to the least decision circuit 90. The decision circuit 90 generates the last bit, that is bit N-3 which is one. Hence, the output for the circuit for this example is 0101 corresponding to decimal 5 which is the sixth voltage level.

FIG. 6, by way of example, illustrates a serial analog-to-digital converter having four output bits corresponding to 16 voltage levels. It will, of course, be realized that more or less stages may be provided. Thus, for the sake of simplicity, the circuit of FIG. 7 illustrates in detail a series arrangement of an analog-to-digital converter having only three output bits rather than four.

Referring now to FIG. 7, the first stage of the serial arrangement of the analog-to-digital converter will be explained in detail. There are again provided two transferred electron devices 91 and 92. These two devices or triodes form a differential pair of amplifiers as explained in connection with FIG. 1. Each of the triodes 91, 92 again has a cathode and an anode as well as a Schottky barrier electrode 93 and 94. The analog signal 35 is impressed on the Schottky electrode 93 of device 91. Similarly, the clock pulse 34 is impressed on the Schottky electrode 94 of the device 91. The two cathodes of the devices 91, 92 are biased through a negative voltage source 95 and the resistors 96 and 97 respectively.

The drain of the field effect transistor 20 is connected to ground through a resistor 21 while its source is connected to the anodes of the two devices 91 and 92. The gate is grounded through the parallel combination of resistor 22 and capacitor 23. However, the field effect transistors 20 again provide a constant current source.

By means of the resistor 97 the device 92 is biased close to threshold, that is close to the knee of the current-voltage characteristic of FIG. 2. On the other hand, resistor 96 is so selected that the device 91 is biased well below its threshold level. Hence the arrival of a clock signal at the device 92 causes a domain to form in the device which reduces its current flow. This in turn causes the current flow in device 91 to increase in the manner previously explained. Whenever the analog input signal exceeds the predetermined level to which the device 91 is biased while the domain is still traveling through the device 92, device 91 will be triggered and a domain will also form in the device 91. This in turn causes an output pulse at its cathode coupled through blocking capacitor 98 to a summing network consisting of resistors 100 and 101 connected in series.

The linear amplifier with a gain of 2 such as amplifier 81 of FIG. 6, is formed by another field effect transistor 103 having its gate connected to the analog input signal. Its source is connected to the voltage source 95 by a bias resistor 104 while its drain is connected to ground through resistors 105 and 106 connected in series. A resistor 107 is connected between the gate of transistor 103 and the junction point of resistors 105, 106.

It will be understood that the output of amplifier 103 is inverted. Hence, the summing resistors 101 and 100 add the inverted output of amplifier 103 to the output of device 91. Hence, the doubled input signal is effectively subtracted from the output of device 91.

Since the circuit operates in cascade the arrival of the clock pulse signal at the next stage 110 must be delayed in time. This time delay depends on the aperture time provided by the device 92. This in turn depends on the active length of the device and on the bias voltage.

The required time delay may be provided by another transferred electron device 111. The device 111 has again a cathode and an anode, the anode being connected to ground. The cathode is biased through a voltage divider from the voltage source 95 through resistor 104, source and drain of transistor 103, resistor 105 and bias resistor 112 which may be made variable as shown. By variation of the value of resistor 112 the delay time can be controlled. The clock pulse is applied to the Schottky electrode 114 of the time delay device 111 and its output is impressed on the Schottky electrode 94'' of the device 94' through a coupling capacitor 115. It will be understood that the output bit, which is bit N, is obtained from lead 116 connected to the blocking capacitor 98.

The succeeding stage 110 operates in the same manner as does the preceding stage to generate the bit N-1 form output lead 116'. The last stage 120 is somewhat simplified because it does not require a time delay device. Otherwise, it is again identical to the previous stage and the output bit N-2 is obtained from output lead 116''.

The performance of the parallel and serial converters of the invention may be compared to the performance of the present state of the art converters utilizing a silicon technology. These results may be summarized as follows:

TABLE

| Parameter | Present Technology | Parallel Converter of the Invention | Serial Converter of the Invention |
| --- | --- | --- | --- |
| Analog input range | ±640 mV | 3.2 V | 3.2 V |
| Sample rate | DC to 400 ms persecond | DC to 10 Gs per second | DC to 10 Gs per second |
| Throughput delay | 8 nsec | 300 p sec | 500 p sec |
| Power dissipation | 6.7 watts | 1.5 watts | 0.25 watts |
| Volume required | 37¼ cu. in. | 1 cu. in. | 1 cu/ in. |
| Output bits | 5 | 5 | 5 |
| Accuracy | ± ½ LSB | ± ½ LSB | ± LSB |

In the above table Gs per second indicates gigasamples per second.

There has thus been disclosed an analog-to-digital converter base on transferred electron devices and field effect transistors. The circuit is such that it lends itself to integrated circuit construction. Both a parallel and a serial configuration of the converter have been disclosed. The serial converter requires less power but is somewhat slower than the parallel circuit. Both circuits are characterized by a much higher speed but smaller volume and a reduced power consumption. The converters represent a considerable advance in the art making possible digital signal processing at much higher speeds and lower cost.

It should be noted that the Gunn effect device or triode such as device 10 in FIG. 4 or device 92 in FIG. 7 which is triggered by the clock pulse is relatively insensitive to the shape of the clock pulse. In other words, as long as the clock pulse raises the voltage to the bias voltage to initiate domain formation, the remaining shape of the clock pulse is entirely immaterial. Hence, the clock pulses need not be of rectangular shape.

What is claimed is:

1. In a comparator circuit for an analog-to-digital converter, a differential amplifier pair comprising:
   a. a first and a second transferred electron device, each having two ohmic electrodes and a SChottky barrier electrode;
   b. a constant current device common to both of said devices for biasing said ohmic electrodes to provide a cathode and an anode for each device, each of said Schottky electrodes being disposed adjacent the associated cathode;
   c. means for applying a clock pulse to the Schottky electrode of said first device; and
   d. means for applying an analog signal to be converted to the Schottky electrode of said second device, each of said devices having a current-voltage characteristic including a negative resistance branch preceded by a knee said first device being biased near the knee of the current-voltage characteristic, and said second device being biased further from the knee of the current-voltage characteristic, whereby a clock pulse will bias said first device into the negative resistance branch and said second device near the knee so as to be able to respond to the analog signal.

2. A differential amplifier pair as defined in claim 1 wherein said constant current source includes a field effect transistor and a voltage source serially connected between the ohmic electrodes of said devices.

3. A differential amplifier pair as defined in claim 1 wherein said first device operates at a higher current level than does said second device.

4. A differential amplifier pair as defined in claim 3 wherein said first device has a width between said anode and said cathode which is wider than that of said second device.

5. In a parallel analog-to-digital converter:
   a. a first and a second transferred electron device;
   b. a first and a second plurality of transferred electron devices, each being associated with one of said first and second devices, each of said devices having two ohmic electrodes and a Schottky barrie electrode;
   c. a first constant current device for biasing the ohmic electrodes of said first device and of said first plurality of devices to provide a cathode and an anode for each of said devices;
   d. a second constant current device for biasing the ohmic electrodes of said second device and of said second plurality of devices to provide a cathode and an anode of each device, each of said Schottky electrodes being disposed adjacent the associated cathode;
   e. means for applying a clock pulse to the Schottky electrode of each of said first and second devices; and
   f. means for applying an analog signal to be converted to the Schottky electrode of each of said first and second plurality of devices, each of said devices having a current-voltage characteristic including a negative resistance branch preceded by a knee, said first and second devices being each biased near the knee of the current-voltage characteristic, and said first and second plurality of devices being biased further from the knee of the current-voltage characteristic, whereby a clock pulse will bias the first and second device into the negative resistance branch while the analog signal will bias one or more of said first and second plurality of devices into the negative resistance branch in accordance with the amplitude of the analog signal, thereby to provide a comparator.

6. A converter as defined in claim 5 wherein said first and second device is so arranged as to carry more current than each of said first and second plurality of devices.

7. A comparator as defined in claim 6 wherein the width of said first and second devices between its anode and cathode is wider than that of each of said first and second plurality of devices.

8. A comparator as defined in claim 5 wherein said constant current devices each include a field effect transistor.

9. A comparator as defined in claim 5 wherein said constant current device is so arranged as to differentially bias each of said first plurality of devices and each of said second plurality of devices.

10. A comparator as defined in claim 5 wherein the number of devices of each of said first and second plurality of devices corresponds to the number of levels into which the analog signal is to be divided.

11. A comparator as defined in claim 5 wherein the cathodes and anodes of said first and second plurality of devices are so coupled as to provide the exclusive OR function.

12. In a parallel analog-to-digital converter:
  a. a first and a second transferred electron device;
  b. a first and a second plurality of transferred electron devices, each being associated with one of said first and second devices, each of said devices having ttwo ohmic electrodes and a Schottky barrier electrode;
  c. a first constant current device for biasing the ohmic electrodes of said first device and of said first plurality of devices to provide a cathode and an anode for each of said devices;
  d. a second constant current device for biasing the ohmic electrodes of said second device and of said second plurality of devices to provide a cathode and an anode of each device, each of said Schottky electrodes being disposed adjacent the associated cathode;
  e. means for applying a clock pulse to the Schottky electrode of each of said first and second devices;
  f. means for applying an analog signal to be converted to the Schottky electrode of each of said first and second plurality of devices, each of said devices having a current-voltage characteristic including a negative resistance branch preceded by a knee, said first and second devices being each biased near the knee of the current-voltage characteristic, and said first and second plurality of devices being biased further from the knee of the current-voltage characteristic, whereby a clock pulse will move the first and second device into the negative resistance branch while the analog signal will bias one or more of said first and second plurality of devices into the negative resistance branch in accordance with the amplitude of the analog signal, thereby to provide a comparator;
  g. means for coupling the cathode of each of said first plurality of devices to the anode of the succeeding device; and
  h. means for coupling the cathode of each of said second plurality of devices to the anode fo the succeeding device, thereby to provide a decoder for generating output signals representative of the amplitude of the analog signal.

13. A converter as defined in claim 12 wherein said first and second device is so arranged as to carry more current than each of said first and second plurality of devices.

14. A comparator as defined in claim 13 wherein the width of said first and second devices between its anode and cathode is wider than that of each of said first and second plurality of devices.

15. A comparator as defined in claim 12 wherein said constant current devices each include a field effect transistor.

16. A comparator as defined in claim 12 wherein said means for coupling the cathode of one device of said first and second plurality of devices to the anode of the adjacent device includes coupling capacitors.

17. A comparator as defined in claim 12 wherein said constant current device is so arranged as to differentially bias each of said first plurality of devices and each of said second plurality of devices.

18. A parallel analog-to-digital converter comprising:
  a. a first and a second transferred electron device;
  b. a first and a second plurality of transferred electron devices, each being associated with one of said first and second devices, each of said devices having two ohmic electrodes and a Schottky barrier electrode;
  c. a first constant current device for biasing the ohmic electrodes of said first device and of said first plurality of devices to provide a cathode and an anode for each of said devices;
  d. a second constant current device for biasing the ohmic electrodes of said second device and of said second plurality of devices to provide a cathode and an anode of each device, each of said Schottky electrodes being disposed adjacent the associated cathode;
  e. means for applying a clock pulse to the Schottky electrode of each of said first and second devices;
  f. means for applying an analog signal to be converted to the Schottky electrode of each of said first and second plurality of devices, each of said devices having a current-voltage characteristic including a negative resistance branch preceded by a knee, said first and second devices being biased near the knee of the current-voltage characteristic, and said first and second plurality of devices being biased further from the knee of the current-voltage characteristic, whereby a clock pulse will bias the first and second device into the negative resistance branch while the analog signal will move one or more of said first and second plurality of devices into the negative resistance branch in accordance with the amplitude of the analog signal, thereby to provide a comparator;
  g. means for coupling the cathode of each of said first plurality of devices to the anode of the succeeding device;
  h. means for coupling the cathode of each of said second plurality of device to the anode of the succeeding device, thereby to provide a decoder for generating output signals representative of the amplitude of the analog signal;
  i. a third plurality of transferred electron devices each having a plurality of separate Schottky barrier electrodes and a pair of ohmic electrodes;
  j. means for biasing the ohmic electrodes of said third plurality of devices to provide a cathode and an anode, said Schottky electrodes of said third plurality of devices being disposed near the associated cathode; and
  k. means for applying the output pulse of each junction of the cathode and adjacent anode of a pair of devices of said first plurality of devices and of said second plurality of devices to at least one of the Schottky electrodes of said third plurality of devices to provide an output bit at each of the anodes of said third plurality of devices.

19. A converter as defined in claim 18 wherein said first and second device is so arranged as to carry more current than each of said first and second plurality of devices.

20. A comparator as defined in claim 19 wherein the width of said first and second devices between its anode and cathode is wider than that of each of said first and second plurality of devices.

21. A comparator as defined in claim 18 wherein said constant current devices each include a field effect transistor.

22. A comparator as defined in claim 18 wherein said means for coupling the cathode of one device of said first and second plurality of devices to the anode of the adjacent device includes coupling capacitors.

23. A comparator as defined in claim 18 wherein said constant current device is so arranged as to differentially bias each of said first plurality of devices and each of said second plurality of devices.

24. A comparator as defined in claim 18 wherein said third plurality of devices is so coupled to associated cathodes and anodes of said first and second plurality to provide the OR function.

25. A comparator circuit as defined in claim 18 wherein the Schottky electrodes of said third plurality of devices are so connected to the coupled outputs of said first and second plurality of devices to provide binary output bits indicative of the amplitude of the analog signal.

26. A serial analog-to-digital converter consisting of a plurality of stages connected in cascade, each of said stages comprising:
   a. a first and a second transferred electron device, each having two ohmic electrodes and a Schottky barrier electrode;
   b. a constant current device common to both of said devices for biasing said ohmic electrodes to provide a cathode and an anode for each device, each of said Schottky electrodes being disposed adjacent the associated cathode;
   c. means for applying a clock pulse to the Schottky electrode of said first device of the first unit;
   d. means for applying an analog signal to be converted to the Schottky electrode of said second device, said first device being so biased that it is triggered by a clock pulse into the negative resistance region of the current-voltage characteristic, said second device being so biased that it will be triggered by an analog signal of a predetermined amplitude into its negative resistance region upon the occurrence of a clock pulse;
   e. a linear amplifier having a predetermined gain and having an input and an output;
   f. means for applying the analog signal to the input of said amplifier;
   g. a summing circuit for summing the output of said amplifier and of said second device of the first unit and for impressing the resulting summing signal on the Schottky electrode of the second device of a second unit and on the amplifier input of said second unit;
   h. a time delay device having an input and an output; and
   i. means for applying the clock signal to the input of said time delay device and its output to the Schottky electrode of the first device of said second unit.

27. A converter as defined in claim 26 wherein said constant current source includes a field effect transistor.

28. A converter as defined in claim 26 wherein said linear amplifier includes a field effect transistor arranged to have a gain of two.

29. A converter as defined in claim 28 wherein said summing network consists of two serially connected resistors connected between the output of said second device and the output of said field effect transistor for summing the output signals, the output signal from said field effect transistor for summing the output signals, the output signal from said field effect transistor being inverted.

30. A converter as defined in claim 26 wherein said time delay circuit consists of an additional transferred electron device having two ohmic electrodes and a Schottky barrier electrode, means for applying the clock pulse to the Schottky electrode of said additional device and means for biasing said ohmic electrodes to provide a cathode in the neighborhood of said Schottky electrode and to provide a desired time delay.

* * * * *